United States Patent [19]
Kinoshita

[11] Patent Number: 6,150,227
[45] Date of Patent: Nov. 21, 2000

[54] INTEGRATED CIRCUIT STRUCTURE WITH A GAP BETWEEN RESISTOR FILM AND SUBSTRATE

[75] Inventor: Yasushi Kinoshita, Tokyo, Japan

[73] Assignee: NEC Corporation, Tokyo, Japan

[21] Appl. No.: 09/046,622

[22] Filed: Mar. 24, 1998

[30] Foreign Application Priority Data

Mar. 24, 1997 [JP] Japan ................................ 9-069732

[51] Int. Cl.[7] ................................................ H01L 21/20
[52] U.S. Cl. .................... 438/384; 438/422; 438/756; 29/610.1
[58] Field of Search .................................. 438/382, 381, 438/384, 421, 422, 619, 756, 50, 53, 383, 411, 684; 257/359, 380, 581, 904, 516, 386; 29/610.1

[56] References Cited

U.S. PATENT DOCUMENTS

| | | |
|---|---|---|
| 5,098,856 | 3/1992 | Beyer et al. ............................. 438/422 |
| 5,599,725 | 2/1997 | Dorleans et al. ......................... 437/40 |
| 5,606,192 | 2/1997 | Harada .................................... 257/377 |
| 5,607,869 | 3/1997 | Yamazaki ................................. 437/40 |
| 5,719,424 | 2/1998 | Ahmad et al. .......................... 257/336 |
| 5,877,059 | 3/1999 | Harward ................................. 438/381 |
| 6,004,832 | 12/1999 | Haller et al. ............................. 438/50 |

FOREIGN PATENT DOCUMENTS

7-122710  5/1995  Japan .

*Primary Examiner*—Olik Chaudhuri
*Assistant Examiner*—Kurt Eaton
*Attorney, Agent, or Firm*—Young & Thompson

[57] ABSTRACT

An integrated circuit structure comprises a conductor film that serves as a passive element or an interconnection, and a silicon substrate. A cavity is disposed between the substrate and the conductor film and thus underneath the conductor film. The substrate is formed by forming an island of oxide film in a surface of the substrate, and then wet etching the island from the surface of the substrate thereby forming the cavity.

23 Claims, 11 Drawing Sheets

INTEGRATED CIRCUIT STRUCTURE WITH A GAP BETWEEN RESISTOR FILM AND SUBSTRATE

FIELD OF THE INVENTION

The present invention relates to an integrated circuit structure that causes a reduction in parasitic capacitance and its fabrication.

BACKGROUND OF THE INVENTION

In the integrated circuits, a diffused layer is widely employed in forming a resistor. The resistor in the form of a diffused layer is a conductor layer that results from migrating impurities, through a diffusion process, into a semiconductor substrate. Parasitic capacitance at a p-n junction between the diffused layered resistor and the substrate hinders high-speed operation expected in the integrated circuits. Thus, in the high performance integrated circuits, a thin resistor film, such as, a polysilicon film, is widely used. An insulator film exists between the thin resistor film and the substrate, providing less parasitic capacitance than the diffused layer does. However, the parasitic capacitance still existing with respect to the substrate induces parasitic impedance. Thus, during operation within high frequency range, the integrated circuit may malfunction due to variation of impedance of elements.

JP-A 7-122710 discloses an integrated circuit structure in which a cavity is disposed between a resistor and a substrate for reduced parasitic capacitance. This known structure is explained in connection with FIGS. 10A to 14B.

Figure 10A:
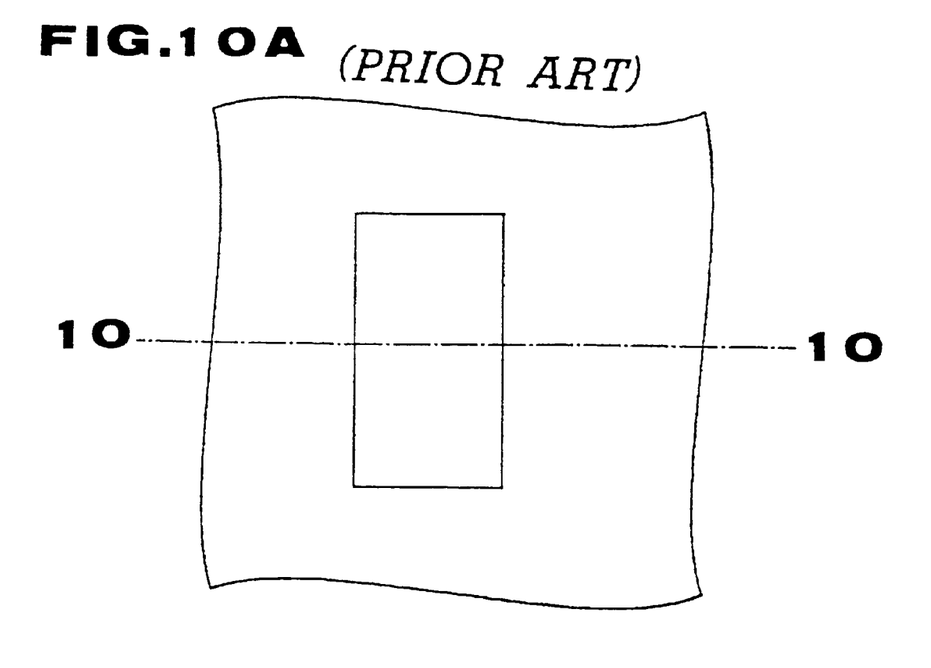
FIG. 10A is a fragmentary plan view of a structure according to the prior art discussed before.
Figure 10B:
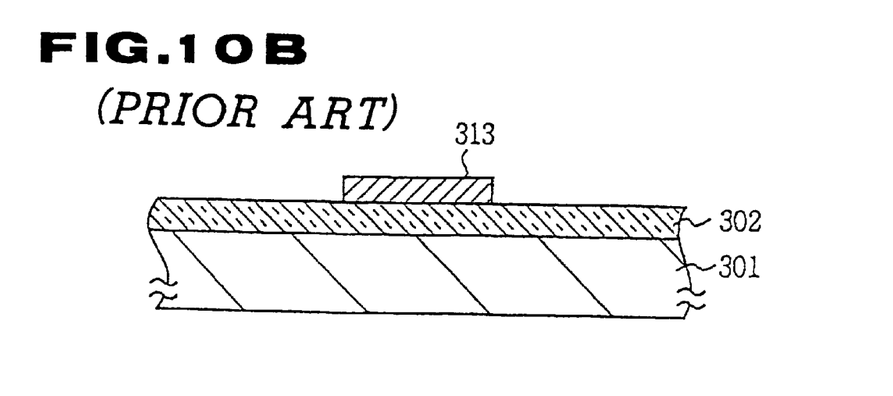
FIG. 10B is a cross sectional view taken through the line 10—10 in FIG. 10A.
Figure 11A:
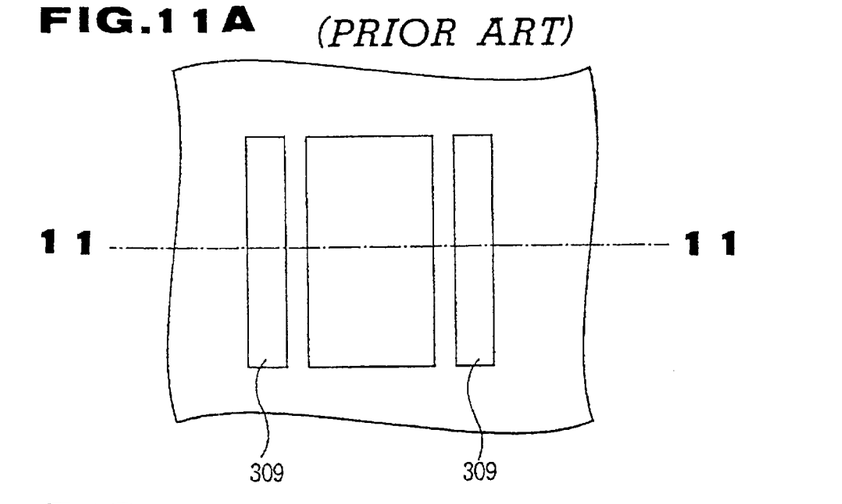
FIG. 11A is a fragmentary plan view showing the structure of FIGS. 10A and 10B after etching insulator film to form grooves thereby to expose surface of the substrate.
Figure 11B:
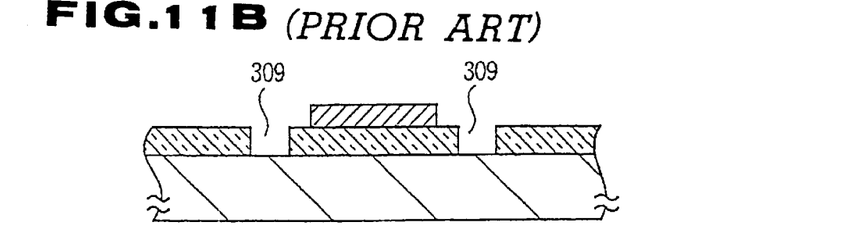
FIG. 11B is a cross sectional view taken through the line 11—11 in FIG. 11A.
Figure 12:
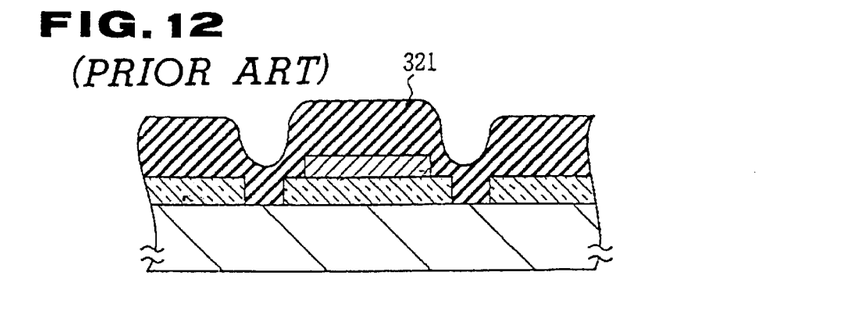
FIGS. 12 and 13 are cross sectional views illustrating the process steps according to the teaching of the prior art discussed before.
Figure 13:
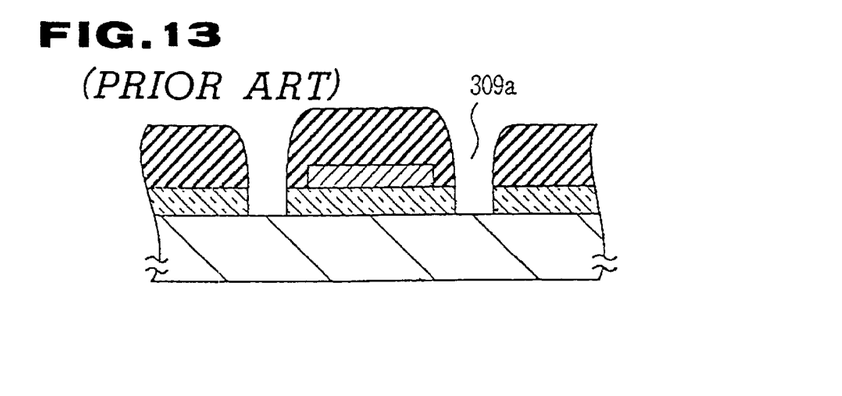
Figure 14A:
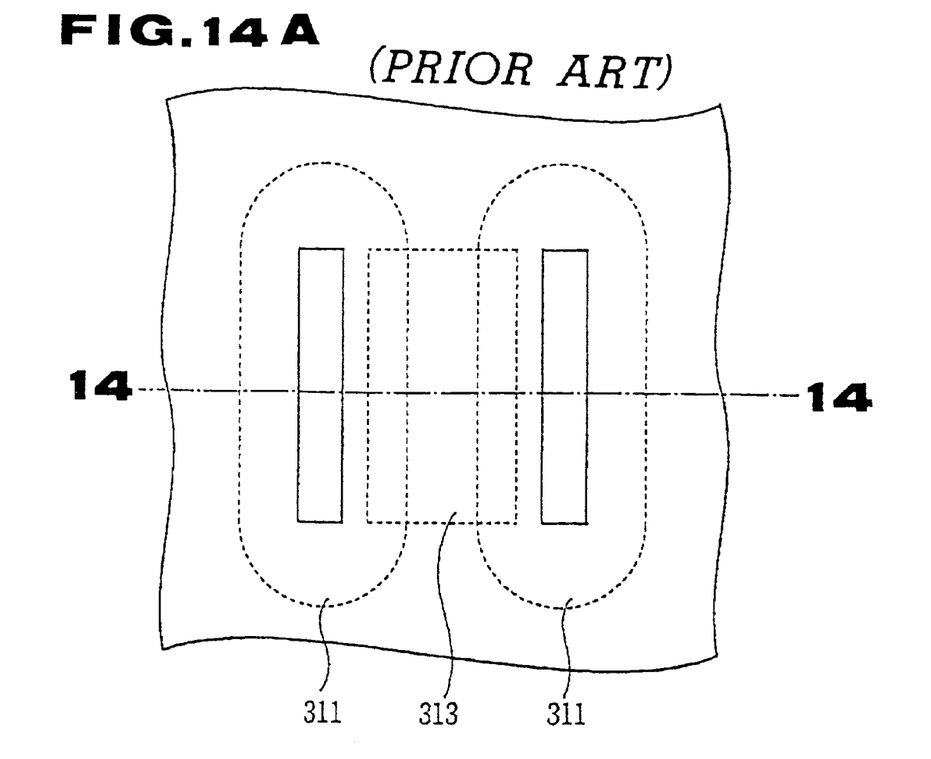
FIG. 14A is a fragmentary plan view showing the structure of FIG. 13 after etching the substrate to form cavities.
Figure 14B:
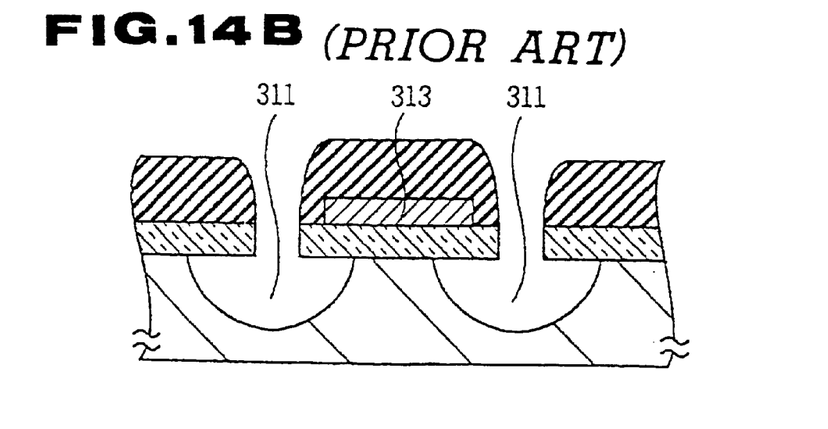
FIG. 14B is a cross sectional view taken through the line 14—14 in FIG. 14A.

As shown in FIGS. 10A and 10B, an insulator film 302 (approximately 500 nanometers in thickness) is formed on a semiconductor substrate 301 by deposition or oxidation. A resistive element of resistor film 313 is formed by patterning after depositing a film of an inorganic material such as polycrystalline silicon (polysilicon) or W—Si—N on the insulator film 302. Subsequently, a resist is used as a mask to protect the resistive element 313. The insulator film 302 is partially removed by etching to form grooves 309 on one and the opposite sides of the resistive element 313 as shown in FIGS. 11A and 11B. Subsequently, as shown in FIG. 12, the surface of the substrate 301 is coated with an insulator film 321 (approximately 200 nanometers in thickness). Specifically, the insulator film 321 coats the insulator film 302 and the resistive element 313. Using a resist, as a mask, not shown, the insulator film 302 is partially etched away to open windows 309a that align with the grooves 309, respectively, as shown in FIG. 13. Admitting solvent for etching into the grooves 309 through the windows 309a, the substrate 301 is etched to remove portions that are located below the resistive element 313 to form cavities 311, as shown in FIGS. 14A and 14B. These Figures show the transient state in which the etching is suspended while the cavities 311 are still isolated. If the etching develops deeper in depth, the cavities 311 will grow into a single cavity.

The etching does not end automatically, making it necessary to specify time for etching. For increased reduction in parasitic capacitance, it is desired to form a single cavity under the resistive element. In the process, not only a portion of the substrate under the resistive but also the adjacent portions thereof are etched away. As a result, a cavity with overabundance of volume is formed under and in the vicinity of the resistive element. This attributes mainly to elongated time required for removing the portion of the substrate under the resistive element.

This known etch technique requires formation of grooves on one and the opposite sides of a resistive element for admission of solvent for etching. This makes it difficult to accomplish circuit integration as expected in the integrated circuits. Besides, since the volume of the cavity is overabundance, the resistive element region becomes structurally weak so that it may be recessed or peeled off due to stress imparted thereto.

An object of the present invention is to increase structural strength of an integrated circuit of the kind having a cavity under a conductor film, which serves as a passive element or an interconnection, without hindering circuit integration.

SUMMARY OF THE INVENTION

According to one aspect of the present invention, there is provided an integrated circuit structure comprising a conductor film, a substrate, and a cavity disposed between said substrate and said conductor film, said substrate being formed by the process comprising the steps of:

preparing a silicon substrate;

forming an island of oxide film in a surface of said substrate; and removing said island from said surface of said substrate thereby forming said cavity.

Specifically, a silicon nitride film is deposited on the exposed portion of the surface of the substrate and on the island. The silicon nitride film cooperates with the substrate to define the cavity after the process step of removing the island.

More specifically, the conductor film, which serves as a passive element or an interconnection, extends above the cavity.

According to another aspect of the present invention, there is provided a method of forming an integrated circuit structure, comprising the steps of:

preparing a silicon substrate;

forming an island of oxide film in a surface of said substrate;

depositing a silicon nitride film on said island and the exposed portion of said surface of said substrate;

removing said island to leave a cavity; and forming a conductor film in a manner to extend above said cavity.

According to further aspect of the present invention, there is provided a method of forming an integrated circuit structure, comprising the steps of:

preparing a silicon substrate;

forming an island of oxide film in a surface of said substrate;

forming a silicon nitride film on said island and the exposed portion of said surface of said substrate;

forming through said silicon nitride film an aperture opening to said island;

removing said island with wet etch via said aperture to leave a cavity; and forming a conductor film in a manner to extend above said cavity.

According to further aspect of the present invention, there is provided a method of forming an integrated circuit structure, comprising the steps of:

preparing a silicon substrate;

forming an island of oxide film in a surface of said substrate;

forming a silicon nitride film on said island and the exposed portion of said surface of said substrate;

forming through said silicon nitride film an aperture opening to said island;

removing said island with wet etch via said aperture to leave a cavity;

depositing a silicon oxide film on said silicon nitride to cover said aperture after the process step of removing said island; and forming a conductor film on a portion of said silicon oxide film in a manner to extend above said cavity.

According to further aspect of the present invention, there is provided a method of forming an integrated circuit structure, comprising the steps of:

preparing a silicon substrate;

forming an island of oxide film in a surface of said substrate;

forming a silicon nitride film on said island and the exposed portion of said surface of said substrate;

forming through said silicon nitride film an aperture that is disposed in the proximity of said island and opening to said island;

removing said island with wet etch via said aperture to leave a cavity;

forming a diffused layer at a portion disposed underneath said aperture after the process step of removing said island;

thermally oxidizing said diffused layer to cause growth of oxide into a cap covering said aperture; and forming a conductor film on a portion of said silicon nitride film in a manner to extend above said cavity.

According to further aspect of the present invention, there is provided a method of forming an integrated circuit structure, comprising the steps of:

preparing a silicon substrate;

forming an island of oxide film in a surface of said substrate;

forming a silicon nitride film on said island and the exposed portion of said surface of said substrate;

forming through said silicon nitride film an aperture opening to said island;

removing said island with wet etch via said aperture to leave a cavity;

depositing a silicon oxide film on said silicon nitride to cover said aperture after the process step of removing said island;

depositing a layer insulation film on said silicon dioxide film; and forming a conductor film on a portion of said layer insulation film in a manner to extend above said cavity.

According to further aspect of the present invention, there is provided a method of forming an integrated circuit structure, comprising the steps of:

preparing a silicon substrate;

forming an island of oxide film in a surface of said substrate;

forming a silicon nitride film on said island and the exposed portion of said surface of said substrate;

forming through said silicon nitride film an aperture that is disposed in the proximity of said island and opening to said island;

removing said island with wet etch via said aperture to leave a cavity;

forming a diffused layer at a portion disposed underneath said aperture after the process step of removing said island;

thermally oxidizing said diffused layer to cause growth of oxide into a cap covers said aperture;

depositing a layer insulation film on said silicon nitride film; and forming a conductor film on a portion of said layer insulation film in a manner to extend above said cavity.

DESCRIPTION OF THE PREFERRED EMBODIMENTS

The following fabrication sequences and the related diagrams illustrate the formation of individual structures. While not specifically shown, multiple structures in any spatial pattern can be simultaneously fabricated.

Figure 6A:
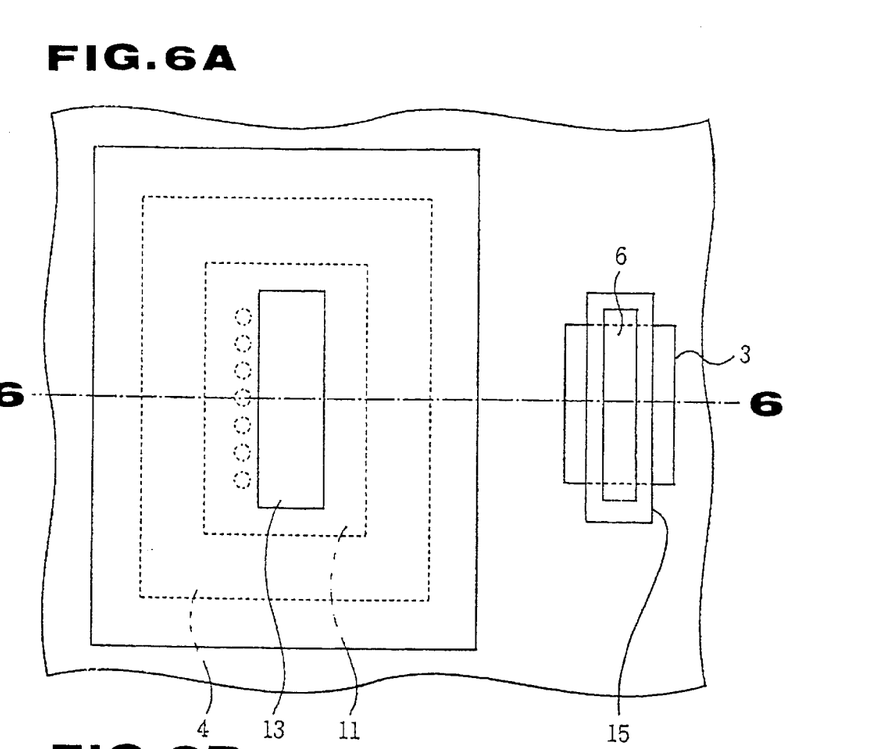
FIG. 6A is a fragmentary plan view showing the structure of FIG. 5A after forming $n^+$ source/drain region after forming a sidewall spacer on the gate electrode.
Figure 6B:
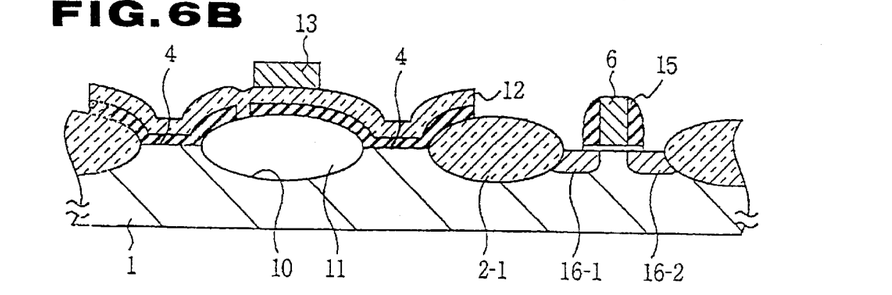
FIG. 6B is a cross sectional view taken through the line 6—6 in FIG. 6A.

FIGS. 1 to 6B demonstrate the fabrication of the structure shown in FIGS. 6A and 6B. Starting with a substrate or base layer 1, which can be made of a p-type silicon semiconductor material, regions isolating oxide film 2-1 and island forming oxide film 2-2 are formed by selective oxidation in the surface of the substrate 1. In this embodiment, the thickness of each of the films 2-1 and 2-2 ranges from 200 to 800 nanometers. The element isolating oxide film 2-1 isolates and defines an active region 3. The island forming oxide film 2-2 is surrounded by a groove 4. Using ion implantation, the substrate 1 is doped to form a well for channel doping of a MOS transistor. The doping level of the channel determines the threshold voltage of the transistor. The channel doping is chosen to give the desired threshold voltage.

Figure 1A:
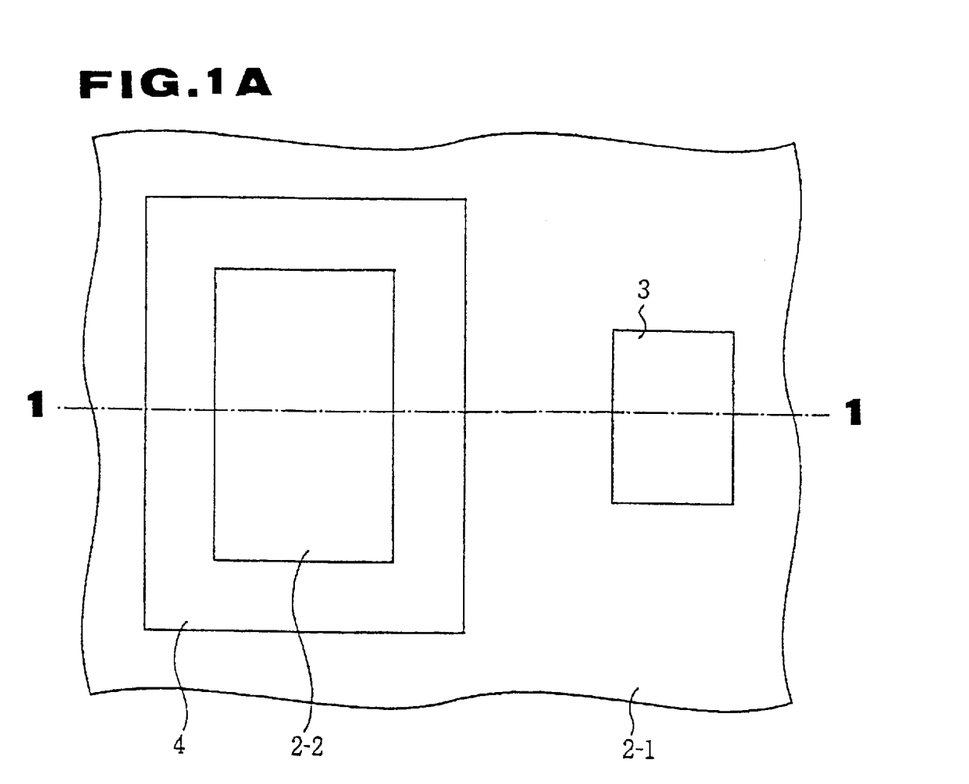
FIG. 1A is a fragmentary plan view of a substrate having, on its surface, an active region isolated by oxide film and an isolated island of oxide film after selective oxidation.
Figure 1B:
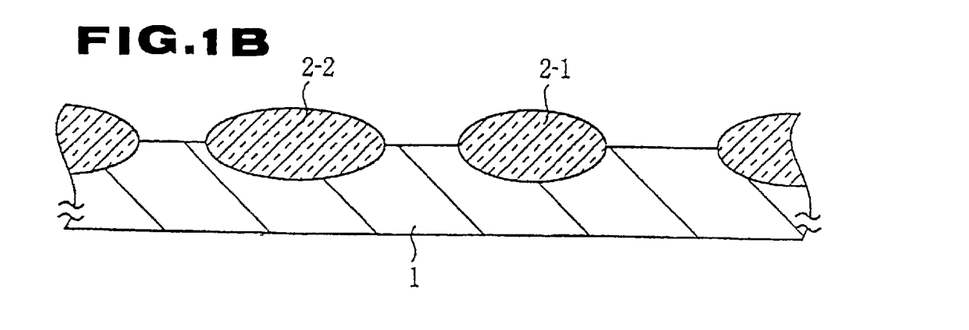
FIG. 1B is a cross sectional view taken through the line 1—1 in FIG. 1A.
Figure 2A:
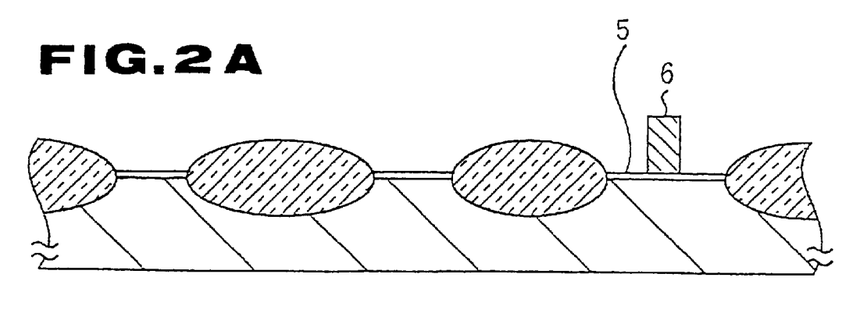
FIG. 2A is a cross sectional view showing the structure of FIG. 1B having, on the exposed surface portions of the substrate, gate oxide film after selective oxidation and having a gate contact or electrode that traverses the active region after patterning.
Figure 2B:
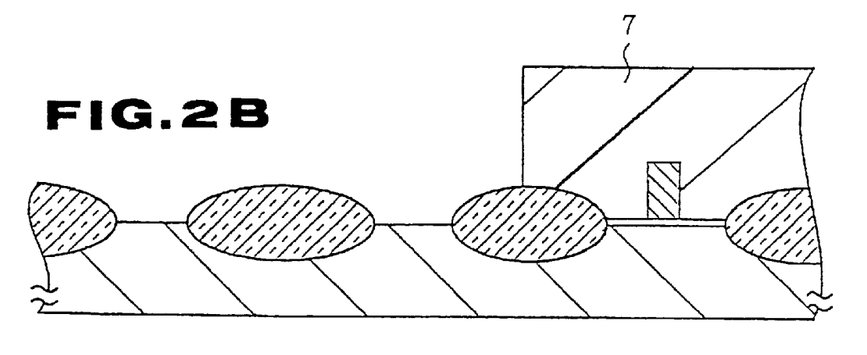
FIG. 2B is a cross sectional view showing the structure of FIG. 2A after wet etching the gate oxide film to expose the surface of the substrate after masking the gate oxide film on the active region and the adjacent portion with a resist.

Referring to FIG. 2B, the entire surface of the substrate 1 is exposed to oxidation to grow oxide to obtain gate oxide film 5 (5 to 15 nanometers in thickness). Crystals are grown to deposit polycrystalline silicon (polysilicon) to obtain polysilicon film (100 to 200 nanometers in thickness) on the gate oxide film 5. The polysilicon film gets etched during patterning to make a gate contact 6 that crosses the active region 3.

Referring to FIG. 2B, after masking the active region 3 and the adjacent areas with a resist film 7, the gate oxide film 5 is wet etched to remove the oxide film from the surface of the groove 4. Thus, the surface of the substrate 1 is exposed in the groove 4 that surrounds the island oxide film 2-2.

Figure 2C:
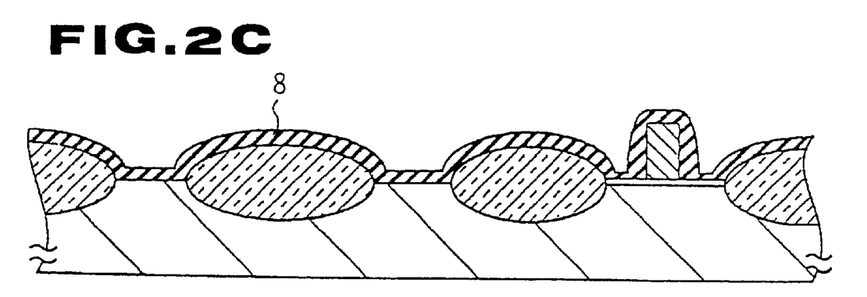
FIG. 2C is a cross sectional view showing the structure of FIG. 2B covered with silicon nitride film grown by low-pressure chemical vapor deposition (LPCVD) process after the resist has been stripped.

Referring to FIG. 2C, the substrate 1 is coated with silicon nitride in LPCVD (low-pressure chemical vapor deposition) process to form silicon nitride film 8 (50 to 200 nanometers in thickness).

Figure 3A:
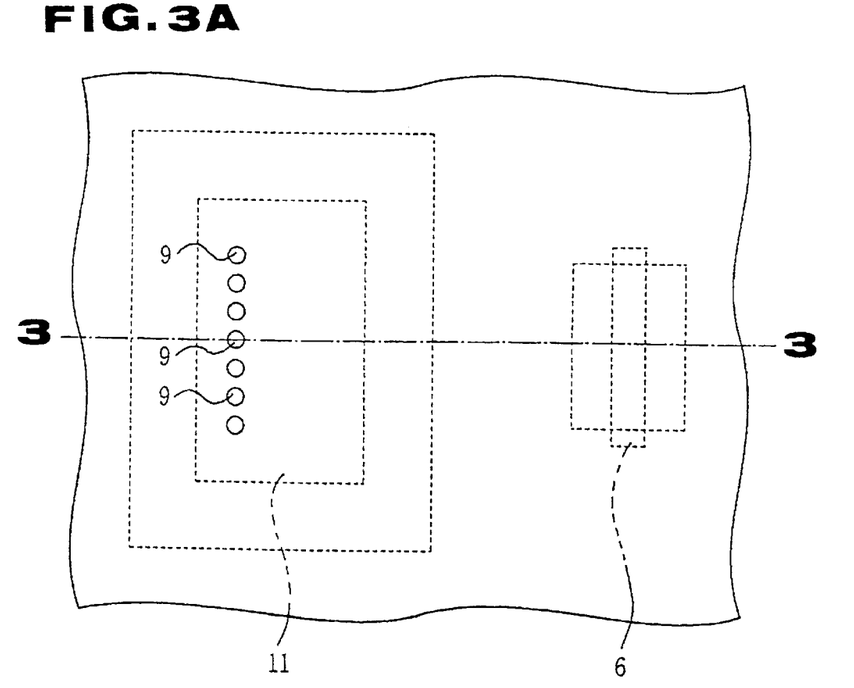
FIG. 3A is a fragmentary plan view showing the structure of FIG. 2C after removing the island with wet etch via apertures formed through the silicone nitride on the island.
Figure 3B:
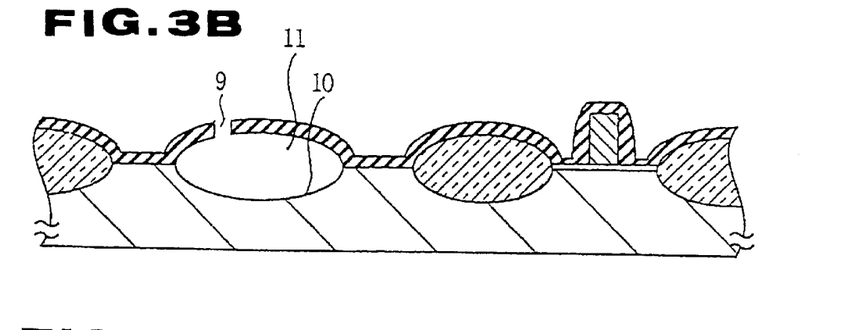
FIG. 3B is a cross sectional view taken through the line 3—3 in FIG. 3A showing a cavity that is left after etching away the island.

Referring to FIGS. 3A to 3B, after masking with a resist, the silicon nitride film is etched to remove silicone nitride on the island 2-2 to open a row of circular apertures 9. The diameter of each of the circular apertures ranges from 0.5 to 1 $\mu$m. The shape of each aperture is not limited to this and may take any configuration if desired. If desired, the row apertures may be replaced with a single elongate slit. Subsequently, a buffered hydrofluoric acid solvent is admitted via the apertures 9 to completely etch the oxide film forming the island 2-2. This removing process results in forming a cavity 11 that includes a recess 10 in the surface of the substrate 1. The silicone nitride film 8 and the substrate 1 have between them the island 2-2 that gets etched with the web etch. This makes it unnecessary to detect end of the etching. No noticeable variations in configuration of the cavity 11 have been found after the wet etch over elongated time.

Figure 4:
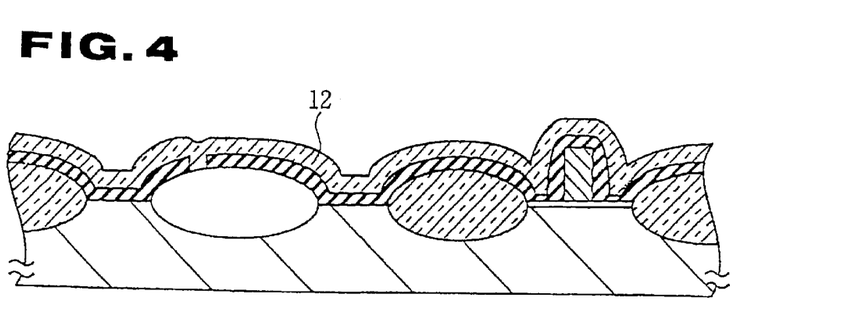
FIG. 4 is a cross sectional view showing the structure of FIG. 3B coated with silicone oxide film.

Referring to FIG. 4, atmospheric pressure CVD (APCVD) process is used to deposit silicon oxide film 12. The thickness of this film 12 is chosen such that crystals of silicon oxide are grown to fill the apertures 9. In the case where each of the apertures 9 is circular, the thickness of the silicone oxide film 12 should be greater than the radius of the circular aperture 9.

Figure 5A:
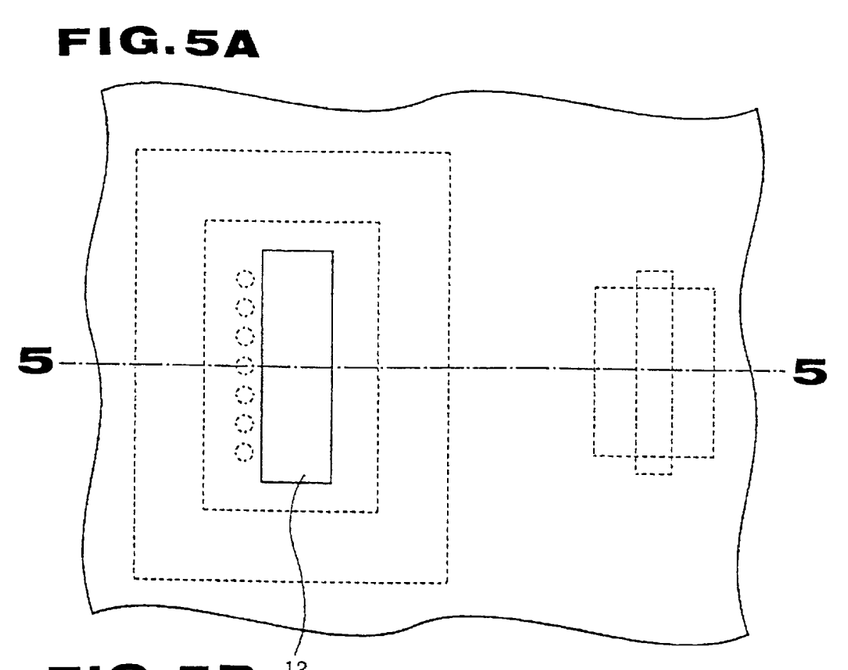
FIG. 5A is a fragmentary plan view showing the structure of FIG. 4 having, above the cavity, a passive element in the form of a resistive element of conductor film after patterning polysilicon film on the silicon oxide film.
Figure 5B:
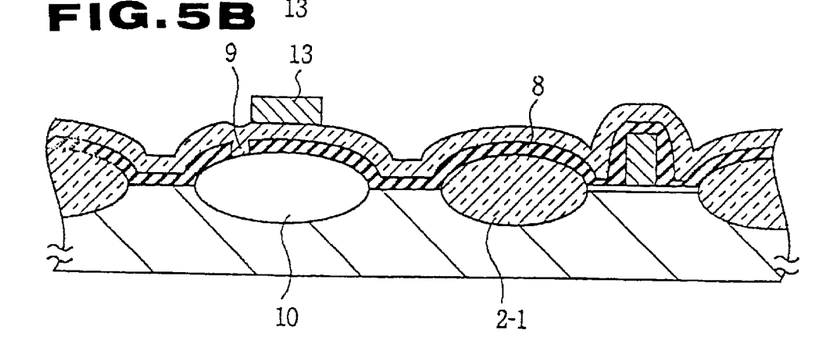
FIG. 5B is a cross sectional view taken through the line 5—5 in FIG. 5A.

Referring to FIGS. 5A and 5B, depositing polysilicon film and the subsequent patterning result in forming a resistor film 13 that extends above the cavity 11. Prior to the patterning process, the polysilicon film is doped by ion implantation for adjustment of its resistivity.

Referring to FIGS. 6A and 6B, anisotropic etching technique is used to etch the silicon oxide film 12 and silicon nitride film 8 thereunder after masking the surface above the cavity 11, the surface above the groove 4 and its the adjacent surface portions. The silicon oxide film 12 and silicon nitride film 8 are left above the cavity 11, groove 4 and its adjacent area. Subsequently, anisotropic etching is used to form a sidewall spacer 15 on the gate electrode 6. After formation of the sidewall spacer 15, ion implant of phosphorus (P) or arsenic (As) creates n⁺ source/drain region 16-1 and 16-2. The ion implant requires the use of a resist, as a mask, having an aperture opening to the active region 3.

Formation of a lightly doped drain (LDD) structure is briefly explained. After formation of a gate electrode 6 as shown in FIG. 2A, using the gate electrode 6 and silicon oxide film 2-1, 2-2, an ion implant creates n⁻ source/drain region. As shown in FIGS. 6A and 6B, a sidewall spacer 15 is formed on the gate electrode 6, and ion implant crates n⁺ source/drain region.

From the preceding description, it is now understood that the active region 3, gate electrode 6 and source/drain region 16-1, 16-2 constitute a MOS transistor, and the resistor film 13 extends above the cavity 11.

In forming the cavity 11, the silicon of the substrate 1 and the silicon nitride layer 8 are not or least etched during wet etching to remove the island 2-2. Etch time can be extended long enough to accomplish complete removal of all of the oxide without damaging the cavity defining walls of the substrate 1 and the silicon nitride layer 8. This means that the shape of the cavity 11 resulting from the wet etch remains unaltered with varying etch time. Besides, the island 2-2 can be deposited by selective oxidation technique, making process monitoring easy. Since the cavity 11 of the designed shape is formed with good reproducibility, a drop in scale of integration and a reduction in structural strength can be suppressed to the minimum level.

Figure 7A:
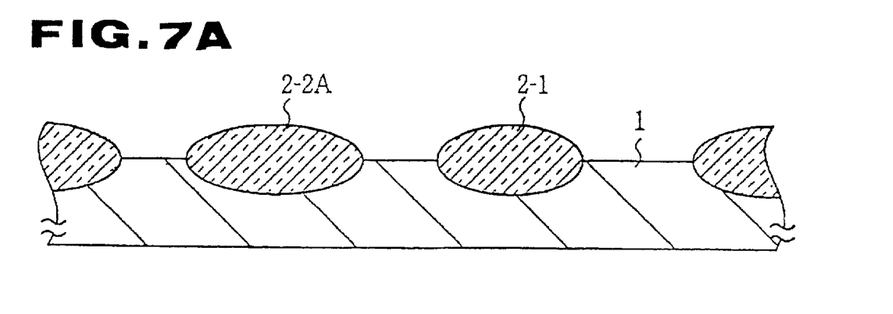
FIG. 7A is a cross sectional view of a second embodiment according to the present invention showing a substrate having an active region isolated by oxide film and an isolated island of oxide film after selective oxidation.
Figure 7B:
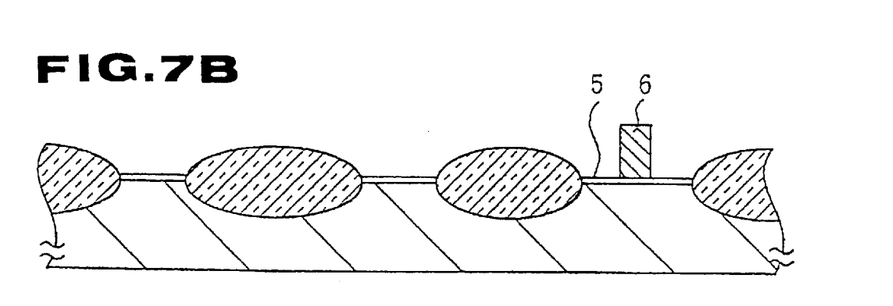
FIG. 7B is a cross sectional view of the structure of FIG. 7A having, on the exposed surface of the substrate, gate oxide film after selective oxidation and having a gate electrode traversing the active region after patterning.
Figure 7C:
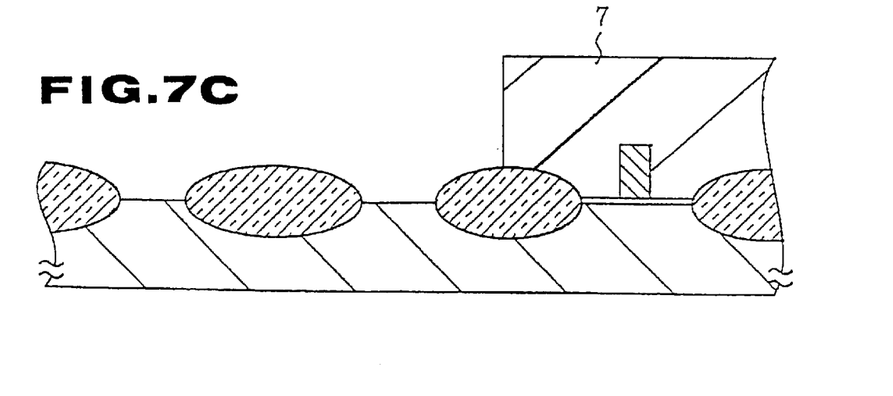
FIG. 7C is a cross sectional view the structure of FIG. 7B after wet etching the gate oxide film to expose the surface of the substrate after masking the gate oxide film on the active region and the adjacent portion with a resist.
Figure 7D:
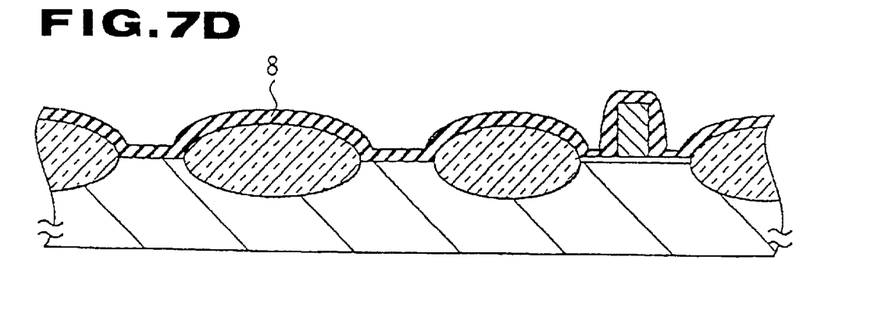
FIG. 7D is a cross sectional view of the structure of FIG. 7C covered with silicon nitride film deposited by LPCVD process after the resist has been striped.
Figure 8A:
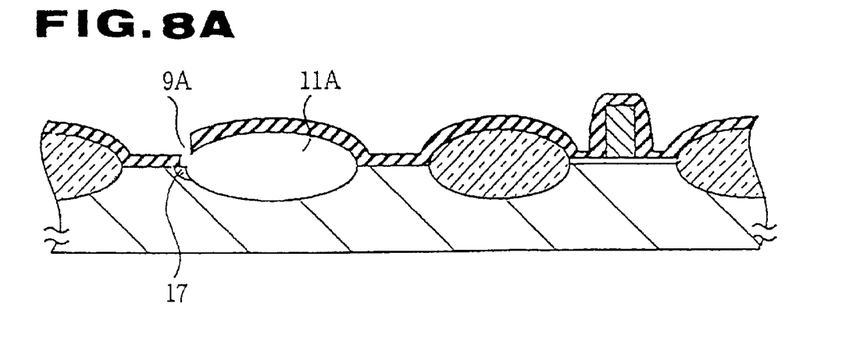
FIG. 8A is a cross sectional view of the structure of FIG. 7D after removing the island with wet etch via aperture and forming $n^+$ diffusing layer in the substrate by ion implantation via the aperture.
Figure 8B:
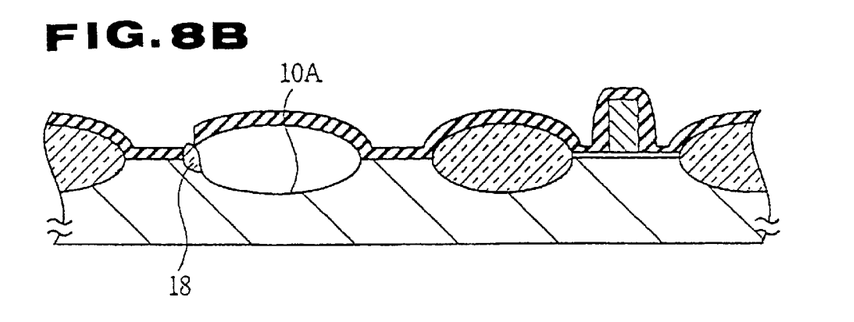
FIG. 8B is a cross sectional view of the structure of FIG. 8A after covering the aperture by a cap that results from growth of oxide out of the $n^+$ diffused layer after annealing.
Figure 8C:
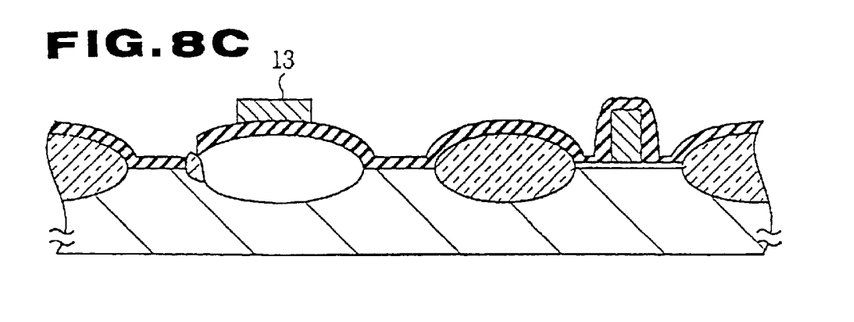
FIG. 8C is a cross sectional view of the structure of FIG. 8B having, above the cavity, a passive element in the form of a resistive element of conductor film after patterning polysilicon film deposited on the silicon nitride film.
Figure 8D:
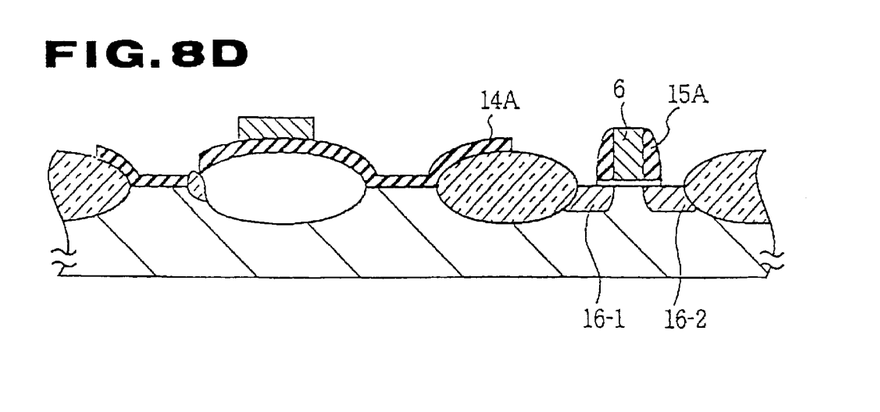
FIG. 8D is a cross sectional view of the structure of FIG. 8C after forming n⁺ source/drain region after forming a sidewall spacer on the gate electrode.

FIGS. 7A to 8D demonstrates the fabrication of the second embodiment of structure shown in FIG. 8D. FIGS. 7A to 7D are the same as FIG. 1B and FIGS. 2A to 2C, respectively, and illustrate in-process structures that have been explained in connection with FIGS. 1B and FIGS. 2A to 2C.

As shown in FIG. 7A, a silicon substrate 1 is subject to selective oxidation to deposit region isolating oxide film 2-1 of thickness 200 to 800 nanometers and island forming film 2-2A of thickness 200 to 800 nanometers. As shown in FIG. 7B, a gate oxide film 5 of thickness 5 to 15 nanometers is deposited on the entire surface of the substrate 1 and a gate electrode 6 is formed. This results from growing crystals to deposit polysilicon film of thickness 100 to 200 nanometers and patterning to define the gate electrode 6. Subsequently, using a resist 7 as a mask to cover an active region where a MOS transistor is formed, wet etches the exposed gate oxide film 5 to expose the silicon surface of the substrate 1 as shown in FIG. 7C. As a result, the gate oxide film 5 has been removed from the surface portion around the island 2-2A. Next, crystals are grown over the entire surface of the substrate 1 to deposit silicon nitride film 8 of thickness 50 to 200 nanometers.

Referring to FIG. 8A, using a resist as a mask, the silicon nitride film 8 is etched to remove silicon nitride from portions that extend across the peripheral edge of the island 2-2 to open a row of circular apertures 9A. The diameter of each of the circular apertures 9A ranges from 0.5 to 1 $\mu$m. The shape of each aperture is not limited to this and may take any configuration if desired. If desired, the row of apertures may be replaced with a single elongate slit. Subsequently, oxide film is wet etched by admission of a buffered hydrofluoric acid solvent via the apertures 9A to completely remove island 2-2A from the surface of the substrate 1. This removing process results in forming a cavity 11A including a recess 10A in the substrate 1. A phosphorus (P) ion implant via the apertures 9A creates n$^+$ diffused layer 17 in the substrate 1. Implantation energies range from 10 keV to 50 keV. Doses range from $1 \times 10^{15}$ ions/cm$^2$ to $1 \times 10^{16}$ ions/cm$^2$. The resist is stripped.

The phosphorus implant shown in FIG. 8A is annealed in nitrogen atmosphere at a temperature that falls in a range from 850° C. to 900° C. for a time that falls in a range from 10 minutes to 30 minutes. During this annealing, oxides are grown rapidly from the n$^+$ diffused layer 17 to make a cap oxide film 19 that covers the apertures 9A as shown in FIG. 8B. In this process, the silicon surface of the recess 10A is slightly oxidized. This does not pose any problem. Referring to FIG. 8C, depositing polysilicon film and the subsequent patterning result in forming a passive element in the form of a resistor film 13 that extends above the cavity 11. Prior to the patterning process, the polysilicon film is doped by ion implantation.

Referring to FIG. 8B, the silicon nitride film is etched with anisotropic etch after masking the surface above the cavity 11, the surface above the groove 4 and its adjacent surface portions. The silicon nitride film 8 is left above the cavity 11, groove 4 and its adjacent area. The silicon nitride film 8 is left on sidewall of the gate contact 6, making a sidewall spacer 15. After formation of the sidewall spacer 15, ion implant of phosphorus (P) or arsenic (As) creates n$^+$ source/drain region 16-1 and 16-2 of the MOS transistor.

According to this second embodiment, the apertures 9A are disposed in the proximity of the periphery of the island 2-2A. This is advantageous over the first embodiment in reducing an area that is occupied by the cavity 11. For providing the same area for deposition of the resistor film 13 above the cavity 11, the area occupied by the cavity 11 fabricated according to the second embodiment can be made smaller than the area occupied by the cavity 11 fabricated according to the first embodiment. Thus, the second embodiment is advantageous over the first embodiment in enhancement of circuit integration.

In the previous description of the embodiments, a resistive element, in the form of resistor film 13, is deposited as a passive element of conductor film. The passive element may take the form of an inductance element or a capacitor element. Thus, the resistor film 13 may be replaced with such inductance element or capacitor element, if desired.

Figure 9A:
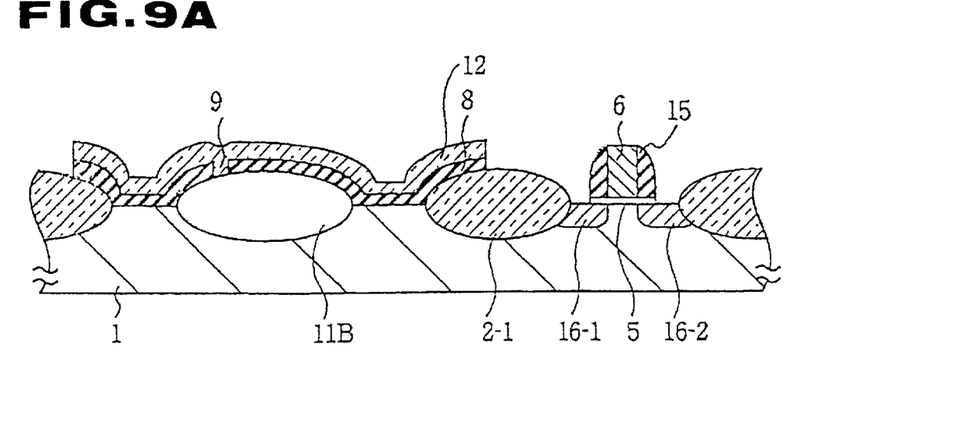
FIG. 9A is a cross sectional view of a third embodiment, showing the structure similar to FIG. 5A.
Figure 9B:
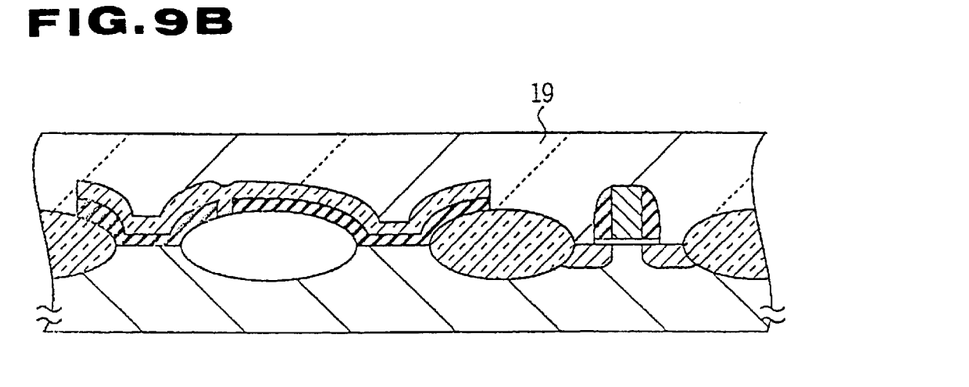
FIG. 9B is a cross sectional view of the structure of FIG. 9A after depositing a layer insulation film.
Figure 9C:
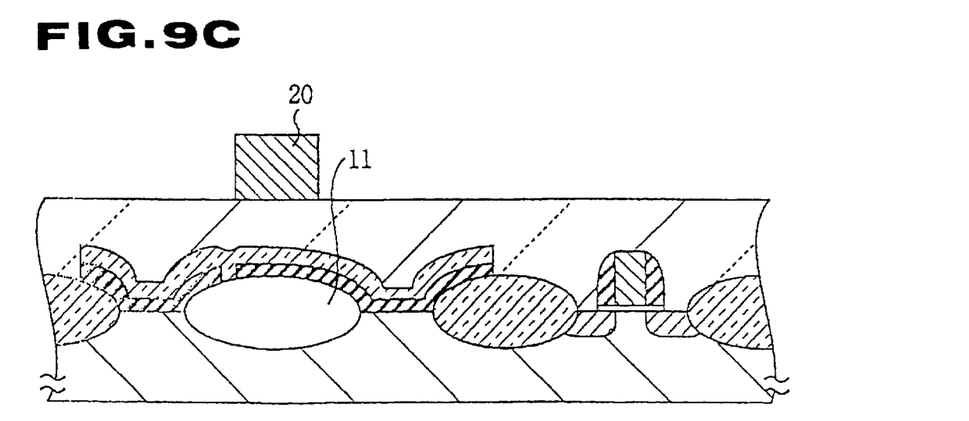
FIG. 9C is a cross sectional view of the structure of FIG. 9B after forming an interconnection layer of conductor film.

FIGS. 9A to 9C demonstrates the fabrication of the third embodiment of structure shown in FIG. 9C. FIG. 9A shows an in-process structure. This structure is substantially the same as that shown in FIG. 6B although the resistor film is not formed yet. For brevity, the same reference numerals are used to designate like parts or portions throughout FIG. 9A and FIG. 6B. The fabrication of the third embodiment is substantially the same as the fabrication of the first embodiment. But, the former differs from the latter in the addition of deposition of a layer insulation film 19 as shown in FIG. 9B and deposition of an interconnection layer 20 of conductor film as shown in FIG. 9C.

Referring to FIG. 9B, after deposition, the layer insulation film 19 is subject to chemical mechanical polishing (CMP) to provide a flat planar surface. After the polishing step, the interconnection layer 20 of Al—Cu film is deposited on the surface of the layer insulation film 19. The interconnection layer 20 extends above the cavity 11. The provision of such cavity 11 between the interconnection layer 20 and the substrate 1 causes a reduction in parasitic capacitance.

The third embodiment has employed formation of cavity according to the first embodiment. Of course, formation of cavity according to the second embodiment may be employed.

What is claimed is:

1. A method of forming an integrated circuit structure, comprising the steps of:
    preparing a silicon substrate;
    forming an island of oxide film in a surface of said substrate;
    depositing a silicon nitride film on said island and an exposed portion of said surface of said substrate surrounding the island;
    removing said island to leave a cavity; and
    forming a resistor film so that an entirety of the resistor film is separated from the silicon substrate by said cavity.

2. A method of forming an integrated circuit structure, comprising the steps of:
    preparing a silicon substrate;
    forming an island of oxide film in a surface of said substrate;
    forming a silicon nitride film on said island and an exposed portion of said surface of said substrate surrounding the island;
    forming through said silicon nitride film at least one aperture opening to said island;
    removing said island with wet etch via said at least one aperture to leave a cavity; and
    forming a resistor film so that an entirety of the resistor film is separated from the silicon substrate by said cavity.

3. A method of forming an integrated circuit structure, comprising the steps of:
preparing a silicon substrate;
forming an island of oxide film in a surface of said substrate;
forming a silicon nitride film on said island and an exposed portion of said surface of said substrate surrounding the island;
forming through said silicon nitride film at least one aperture opening to said island;
removing said island with wet etch via said at least one aperture to leave a cavity;
filling each of said at least one aperture after removing said island; and
forming resistor film so that an entirety of the resistor film is separated from the silicon substrate by said cavity.

4. A method of forming an integrated circuit structure, comprising the steps of:
preparing a silicon substrate;
forming an island of oxide film in a surface of said substrate;
forming a silicon nitride film on said island and an exposed portion of said surface of said substrate surrounding the island;
forming through said silicon nitride film at least one aperture that is disposed in the proximity of said island and opening to said island;
removing said island with wet etch via said at least one aperture to leave a cavity;
forming a diffused layer in the substrate in an area disposed underneath said aperture after the process step of removing said island;
thermally oxidizing said diffused layer to cause growth of oxide into a cap covering said aperture; and
forming a resistor film so that an entirety of the resistor film is separated from the silicon substrate by said cavity.

5. A method of forming an integrated circuit structure, comprising the steps of:
preparing a silicon substrate;
forming an island of oxide film in a surface of said substrate;
forming a silicon nitride film on said island and an exposed portion of said surface of said substrate surrounding the island;
forming through said silicon nitride film at least one aperture that is disposed in the proximity of said island and opening to said island;
removing said island with wet etch via said at least one aperture to leave a cavity;
forming a diffused layer at a portion disposed underneath said aperture after the process step of removing said island;
thermally oxidizing said diffused layer to cause growth of oxide into a cap that covers said aperture; and
forming a resistor film so that an entirety of the resistor film is separated from the silicon substrate by said cavity.

6. The method of claim 1, wherein an entirety of the resistor film is contained within boundaries of the cavity.

7. The method of claim 2, wherein the at least one aperture opening to the island is a plurality of openings.

8. The method of claim 7, wherein the resistor film does not overlie any of the at least one aperture.

9. The method of claim 7, wherein each of the plurality of openings is circular.

10. The method of claim 9, wherein all of the plurality of openings are arranged in a line.

11. The method of claim 10, wherein the resistor film does not overlie any of the at least one aperture.

12. The method of claim 7, wherein the at least one aperture opening consists of a single elongated slit.

13. The method of claim 12, wherein the single elongate slit is arranged along an edge of the island.

14. The method of claim 13, wherein the resistor film does not overlie any of the single elongate slit.

15. The method of claim 12, wherein the single elongated slit is arranged away from an edge of the island.

16. The method of claim 15, wherein the resistor film does not overlie any of the single elongate slit.

17. The method of claim 3, wherein the filling step is performed by depositing a silicon oxide film on the silicon nitride film.

18. The method of claim 4, wherein the step of thermally oxidizing the diffused layer reaches temperatures in the range of 850° C. to 900° C.

19. The method of claim 4, wherein the diffused layer is formed by implanting phosphorus ions in the substrate through the at least on aperture.

20. The method of claim 19, wherein the step of forming a diffused layer is followed by annealing the phosphorus implant.

21. The method of claim 20, wherein the annealing step is performed in a nitrogen atmosphere.

22. The method of claim 20, wherein the annealing step is performed at a temperature in the range of 850° C. to 900° C.

23. The method of claim 22, wherein the annealing step is performed in a range of from 10 minutes to 30 minutes.

* * * * *